(12) United States Patent
Belouet

(10) Patent No.: US 8,092,594 B2
(45) Date of Patent: Jan. 10, 2012

(54) CARBON RIBBON TO BE COVERED WITH A THIN LAYER MADE OF SEMICONDUCTOR MATERIAL AND METHOD FOR DEPOSITING A LAYER OF THIS TYPE

(75) Inventor: Christian Belouet, Sceaux (FR)

(73) Assignee: SOLARFORCE, Bourgoin Jallieu (FR)

( * ) Notice: Subject to any disclaimer, the term of this patent is extended or adjusted under 35 U.S.C. 154(b) by 1057 days.

(21) Appl. No.: 11/920,018

(22) PCT Filed: Jun. 7, 2006

(86) PCT No.: PCT/FR2006/005030
§ 371 (c)(1),
(2), (4) Date: Nov. 6, 2007

(87) PCT Pub. No.: WO2006/134292
PCT Pub. Date: Dec. 21, 2006

(65) Prior Publication Data
US 2009/0302425 A1 Dec. 10, 2009

(30) Foreign Application Priority Data
Jun. 17, 2005 (FR) ...................... 05 51655

(51) Int. Cl.
*C30B 28/10* (2006.01)
*C30B 15/34* (2006.01)
(52) U.S. Cl. ............... 117/16; 117/13; 117/23; 117/26; 117/73; 118/101; 118/401; 118/404; 118/405; 257/618; 257/619; 257/622; 257/E29.005; 257/E29.089; 257/E21.09

(58) Field of Classification Search ............... 257/618, 257/619, 622, E29.005, E29.089, E21.09; 117/13, 16, 23, 26, 73; 118/101, 401, 404, 118/405
See application file for complete search history.

(56) References Cited

U.S. PATENT DOCUMENTS

| 3,429,734 | A | | 2/1969 | Coad ............................ 427/282 |
| 4,112,135 | A | * | 9/1978 | Heaps et al. ................... 438/479 |
| 4,520,752 | A | * | 6/1985 | Belouet ......................... 118/405 |
| 4,616,595 | A | | 10/1986 | Belouet ......................... 118/405 |
| 4,627,887 | A | * | 12/1986 | Sachs ............................. 117/24 |
| 5,441,577 | A | * | 8/1995 | Sasaki et al. ................... 136/244 |
| 2004/0139910 | A1 | * | 7/2004 | Sachs ............................. 117/13 |

OTHER PUBLICATIONS

International Search Report From Application No. PCT/FR2006/0580530 Dated Jan. 22, 2007.

* cited by examiner

*Primary Examiner* — Michael Kornakov
*Assistant Examiner* — Kenneth A Bratland, Jr.
(74) *Attorney, Agent, or Firm* — Sofer & Haroun, LLP

(57) ABSTRACT

The present invention relates to a carbon ribbon for covering in a thin layer of semiconductor material, and to a method of deposited such a layer on a substrate constituted by a carbon ribbon. At least one of the two faces of the carbon ribbon is for covering in a layer of semiconductor material by causing the ribbon to pass substantially vertically upwards through a bath of molten semiconductor material. According to the invention, the two edges of at least one of the two faces of the carbon ribbon project so as to form respective rims.

16 Claims, 2 Drawing Sheets

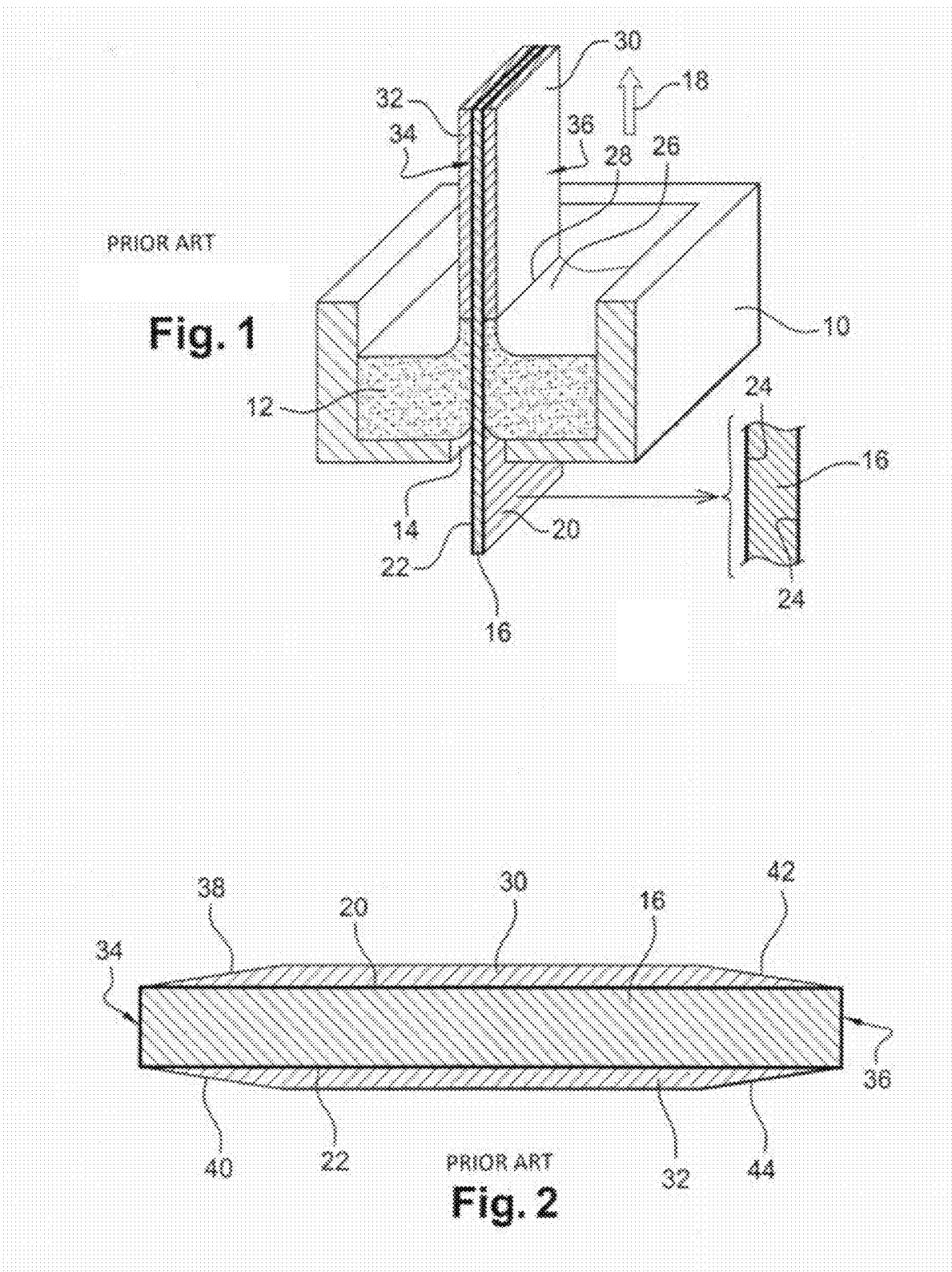

CARBON RIBBON TO BE COVERED WITH A THIN LAYER MADE OF SEMICONDUCTOR MATERIAL AND METHOD FOR DEPOSITING A LAYER OF THIS TYPE

RELATED APPLICATIONS

This application is a National Phase application of PCT/FR2006/050530, filed on Jun. 7, 2006, which in turn claims the benefit of priority from French Patent Application No. 05 51655, filed on Jun. 17, 2005, the entirety of which is incorporated herein by reference

FIELD OF THE INVENTION

The present invention relates to a carbon ribbon for covering in a thin layer of semiconductor material, and to a method of depositing such a layer on a substrate constituted by a carbon ribbon.

BACKGROUND OF THE INVENTION

Photovoltaic cells comprise thin plates of semiconductor material, with the most commonly used material presently being polycrystalline silicon. The invention applies most particularly to pulling silicon ribbons for use in fabricating photovoltaic cells, with the description below thus relating to silicon, it being understood that the invention applies equally to other semiconductor materials such as germanium and type III-V semiconductor compounds of the GaAs family with congruent or quasi-congruent melting. The silicon plates are preferably obtained from a layer of silicon that forms a film deposited on a carbon substrate by pulling the substrate through a bath of molten silicon. The substrate has the form of a ribbon.

FIG. 1 is a general diagram showing the prior art method referred to as the ribbon on temporary substrate (RTS) method. A crucible 10 fitted with heater means (not shown) contains a bath 12 of molten silicon in liquid form. The bottom of the crucible has a slot 14. Using pulling means (not shown), a carbon ribbon 16 of small thickness (of the order of 200 micrometers ($\mu$m) to 350 $\mu$m) is pulled substantially vertically upwards in the direction of arrow 18 through the silicon bath 12 at substantially constant speed. The two faces 20 and 22 of the ribbon are initially covered in a thin layer of pyrolytic carbon 24 (thickness about 1 $\mu$m to 5 $\mu$m). The molten silicon wets the two faces 20 and 22 of the ribbon, and a meniscus 26 of liquid silicon forms on each face of the ribbon, with a solid-liquid connection line 28 that is situated at about 6.8 mm from the surface of the bath in the central portion of the ribbon. A thin layer of silicon 30-32 then forms on each of the two faces 20 and 22 of the carbon ribbon. The shape and the dimensions of the slot 14 are adapted firstly to allow the carbon ribbon 16 to penetrate into the crucible, and secondly to avoid molten silicon from flowing out through the slot. Although it is advantageous to obtain two silicon films 30 and 32 simultaneously, one film on each face of the ribbon, it is possible to use a technique in which only one film is obtained by preventing silicon from becoming deposited on one of the two faces.

The RTS method is described for example in patents FR 2 386 359 and FR 2 561 139.

That pulling method is nevertheless confronted with the problem of the liquid silicon meniscus being unstable in the proximity of each edge 34-36 of the carbon ribbon 16. It has been found that the solid-liquid connection line 28 tends to drop from typically about 6.8 mm to 2 mm to 4 mm relative to the surface of the silicon bath at the edges of the ribbon, over a width of about 5 mm from each edge. As a result the thickness of the silicon layer 30 or 32 that is deposited on each face of the carbon ribbon decreases going towards the edges 34 and 36 down to a value of practically zero.

FIG. 2 is a diagram showing the progressive thinning on the edges of the semiconductor layers obtained by the prior art method shown in FIG. 1. The section of the carbon ribbon 16 shown in cross-section and without the layers 24 of pyrolytic carbon is substantially rectangular in shape. The two semiconductor layers 30 and 32 are deposited simultaneously on the two faces 20 and 22 respectively of the ribbon. In the zones 38-40 and 42-44 adjacent to the two edges 34 and 36 respectively of the ribbon, the thickness of the layers decreases progressively over a distance that is typically about 5 mm. Semiconductor films made in this way are therefore particularly fragile at the edges. In addition, it is found that nucleation from grains of small dimensions propagates in the side portions of the film, thereby decreasing the photovoltaic performance of the silicon film.

Solutions to the above problem are proposed in patents FR 2 568 490 and FR 2 550 965. Those solutions consist in raising the level of the solid-liquid line at the edges of the carbon ribbon with the help of external means placed close to the edges of the ribbon. Thus, the first above-mentioned patent makes use of plates that locally raise the level of the bath of molten silicon by capillarity, and the second above-mentioned patent proposes placing a trough in register with each edge of the silicon ribbon, likewise for locally raising the level of the bath of molten silicon. Those solutions complicate fabricating the pulling structure and the pulling operation itself.

OBJECTS AND SUMMARY OF THE INVENTION

The present invention provides a solution to the above problem that does not make use of external means. It consists in adapting the shape of the edges of the carbon ribbon used as a temporary support for the semiconductor layers, so as to increase the thickness of the semiconductor layers that are deposited on said edges.

More precisely, the invention provides a method of depositing a layer of semiconductor material on at least one of the two faces of a carbon ribbon, said ribbon having two edges, in which method the ribbon is pulled progressively upwards, substantially vertically, lengthwise through the horizontal equilibrium surface of a bath of molten semiconductor material, which becomes deposited by wetting said face as the carbon ribbon is pulled. The method consisting in changing the shape of the edges of the ribbon so as to increase the thickness of the layer of semiconductor material that is deposited on the edges of the ribbon.

In a particular implementation, each of the edges of the ribbon is given a projecting shape, which shape may, for example, be flared, rectangular, or triangular.

In a preferred implementation, a layer of semiconductor material is deposited simultaneously on both faces of the ribbon, and each of the two edges of the ribbon is given a double rim shape.

For example, the change in shape is obtained by forming, by continuously upsetting the edges of the ribbon towards each other.

When the semiconductor material is silicon, the carbon ribbon is advantageously covered in a layer of pyrolytic carbon on which the silicon layer is deposited.

The invention also provides a carbon ribbon having two edges, with at least one of its two faces being designed to be covered in a layer of semiconductor material by causing said ribbon to pass substantially vertically upwards through a bath of molten semiconductor material. According to the invention, each of its two edges on at least one of its two faces projects to form a rim.

In an embodiment, each of the two edges of the carbon ribbon flares so as to form a half-round shape, or a rounded shape depending on whether only one face of the ribbon or both faces are considered.

In another embodiment, each edge of the ribbon forms a shoulder that is substantially perpendicular to the face of the ribbon that is to receive the layer of semiconductor material, the rim then being rectangular.

In another embodiment, each edge of the ribbon forms a shoulder that slopes relative to the face of the ribbon that is to receive the layer of semiconductor material, the rim then being triangular.

Both of the edges of the ribbon advantageously include a respective external portion substantially perpendicular to the face of the ribbon that is to receive the layer of semiconductor material, said external portion possibly including a portion that is set back into the ribbon or being in the form of a half-drop of tallow or in the form of a drop of tallow.

In an embodiment, the semiconductor material is deposited on both faces of the ribbon, each edge of the carbon ribbon then forming a double rim.

The semiconductor material is selected from silicon, germanium, and type III-V semiconductor compounds of the GaAs family with congruent or quasi-congruent melting.

BRIEF DESCRIPTION OF THE DRAWINGS

Other characteristics and advantages of the invention appear from the following description given purely by way of example and made with reference to the accompanying drawings, in which:

FIG. 1 is a diagram showing the prior art method for obtaining one or two semiconductor films by pulling a carbon ribbon through a bath of molten semiconductor;

FIG. 2 shows the thinning of the semiconductor layers obtained by the conventional, prior art method.

MORE DETAILED INVENTION

Figure 3A:
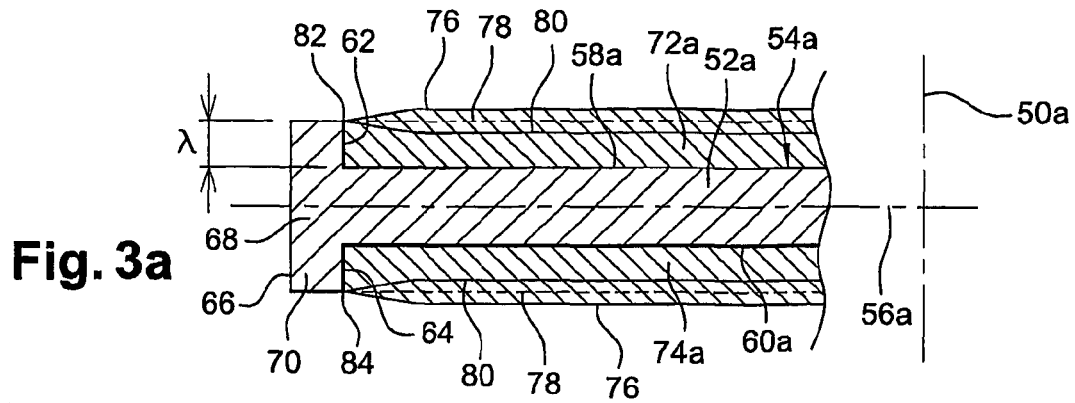
FIGS. 3a, 3b, 3c, and 3d are diagrams in section showing shapes obtained for the edge of a carbon ribbon in accordance with the invention.

In the invention, the edges of the carbon ribbon are of a shape that is modified so as to modify the shape of the wetting surface of the molten semiconductor material on the two edges of the ribbon, for the purpose of increasing the thickness of the layer of semiconductor material deposited on the edges of the ribbon.

FIGS. 3a, 3b, 3c, and 3d are diagrammatic cross-sections showing a plurality of embodiments of the carbon ribbon in accordance with the present invention. To simplify writing and reading the text below, when a reference, e.g. R, relates to the embodiments of FIGS. 3a, 3b, 3c, and 3d, then it is written Ra,b,c,d instead of Ra, Rb, Rc, Rd. If the reference R applies for example only to the embodiments of FIGS. 3b, 3c, and 3d, then it is written 3b,c,d.

In the figures, the ribbon is shown coated in two layers of semiconductor, each of them forming a semiconductor film after the carbon ribbon has been eliminated. The midplane 50a,b,c,d passing through the middle of the ribbon and perpendicularly to the two faces of the ribbon constitutes a plane of symmetry. Thus, in these FIG. 3, only the left-hand end of the ribbon is shown, the right-hand end being identical to the left-hand end and symmetrical about said midplane 50a,b,c,d.

In FIGS. 3a to 3d, the carbon ribbons are identical except for the shape of the edges of the ribbons. Ignoring the edges, the cross-sections 52a,b,c,d of the carbon ribbons 54a,b,c,d are generally rectangular in shape possessing a longitudinal axis of symmetry 56a, 56b, 56c, or 56d parallel to the two faces of the ribbon respectively 58a-60a, 58b-60b, 58c-60c, and 58d-60d. The two edges of each of the two faces of the ribbons are terminated in projecting manner so as to form a rim. The projecting shape serves to increase the thickness of the layer of semiconductor material deposited on the edges of the ribbon.

Thus, in FIG. 3a, the two ends or edges of each of the faces 58a and 60a is terminated by a respective wall 62 or 64 forming a shoulder that is substantially perpendicular to the faces 58a and 60a. If the length of the shoulder is equal to $\lambda$, the thickness of the carbon ribbon at its edges is $2\lambda$ greater than the thickness in the center of the ribbon. The side face of the ribbon is formed by a wall 66 that is substantially perpendicular to the longitudinal axis of symmetry 56a. The edge of the ribbon situated above the longitudinal axis of symmetry 56a co-operates with the face 58a and the wall 62 to form a rectangular rim 68 that projects relative to the face 58a. Similarly, the edge of the ribbon situated beneath the longitudinal axis of symmetry 56a co-operate with the face 60a and the wall 64 to form a rectangular rim 70 that projects relative to the face 60a. Together the two rims 68 and 70 constitute a double rim.

Two semiconductor layers 72a,b, c and d and 74a, b, c and d can be deposited on the faces of the carbon ribbon, using the method descried above with reference to FIG. 1, after previously depositing a layer of pyrolytic graphite on the two faces of the carbon ribbon. The thickness of the semiconductor layers varies as a function of the speed with which the ribbon is pulled. The height .lamda. of the rim is advantageously selected to be equal to or less than the thickness of the semiconductor layer. In FIG. 3a, three layer thicknesses are shown so as to illustrate the profile of the outside faces 76, 78, and 80 of the layers in the vicinity of the rims 68 and 70. It can be seen that regardless of their thickness, the layers join the rim 68 or 70 at the end 82 or 84. As a result the thickness of the margins of the semiconductor layers no longer diminishes to tend towards a thickness close to zero as in the prior art. Furthermore, practically no semiconductor becomes deposited on the outside face of the carbon ribbon constituted by the wall 66. This absence of semiconductor on the wall 66 facilitates a subsequent operation of the RTS method that consists in burning off the carbon ribbon in a furnace so as to separate the two semiconductor layers 72a,b, c and d and 74a,b, c and d.

Figure 3B:
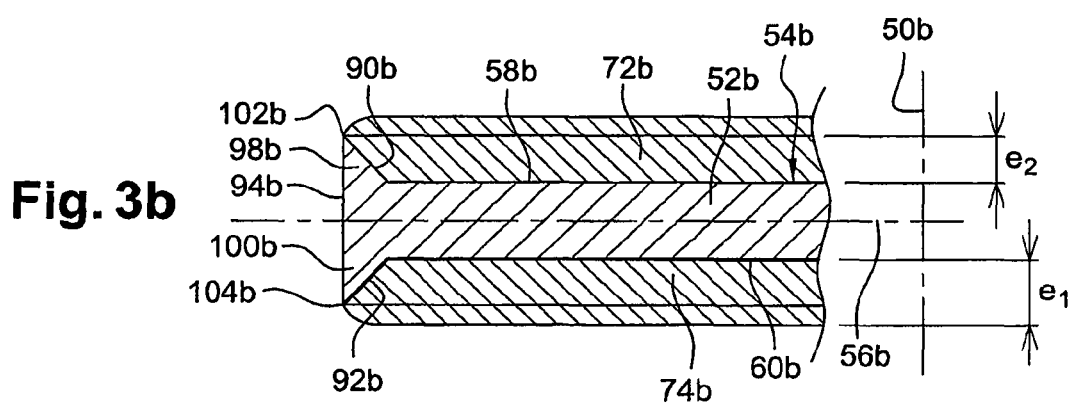
Figure 3C:
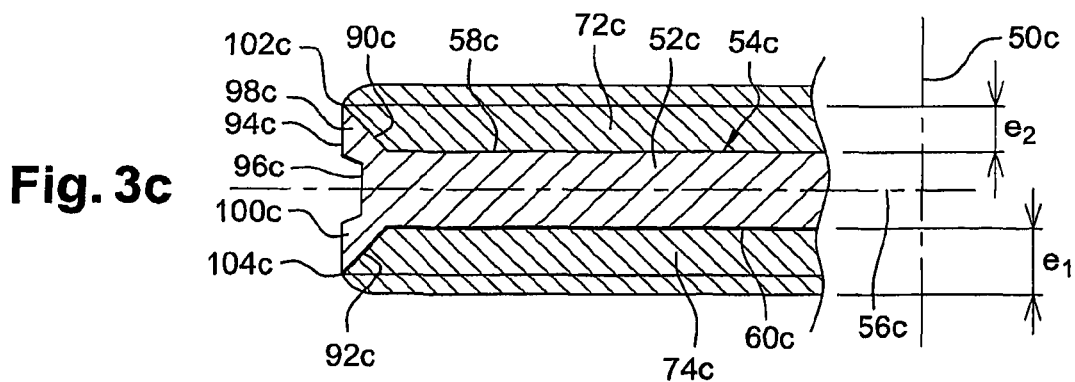
Figure 3D:
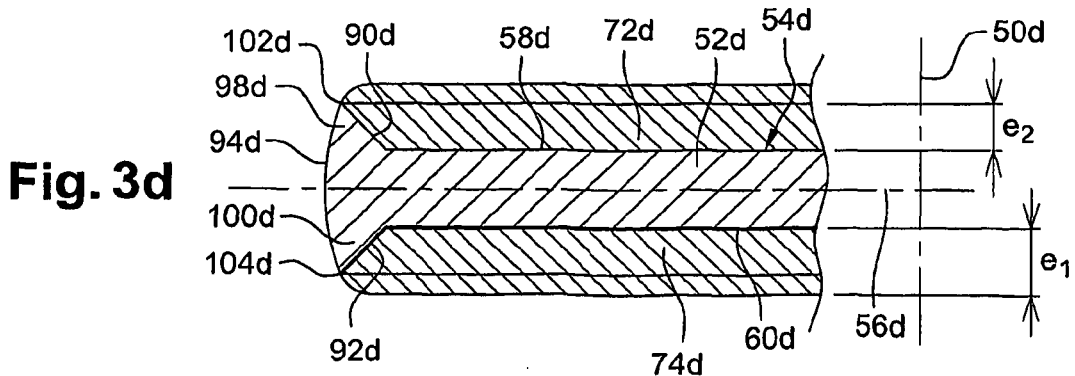

In FIGS. 3b, 3c, and 3d, the edges of the ribbons have projecting shapes, so as to form a double rim that is triangular. The edges of the faces 58b,c,d and 60b,c,d of the ribbons are each constituted by two walls 90b,c,d and 92b,c,d sloping outwards from the faces of the ribbon and by a wall 94b,c,d that is substantially perpendicular to the longitudinal axis of symmetry 56b,c,d. The walls 94b,c,d form side faces of the ribbons. The shapes of these faces differ in the various figures: in FIG. 3b, the wall 94b is plane in shape; in FIG. 3c, the wall 94c has a setback 96c; and in FIG. 3d, the wall 94d is in the shape of a drop of tallow (or a half-drop of tallow if only one face 58d or 60d is considered together with the respective walls 90d or 92d).

Each of the walls 90b,c,d co-operates with the faces 94b, c,d to form a triangular rim 98b,c,d. Likewise, each of the walls 92*b,c,d* co-operates with the faces 94*b,c,d* to form a triangular rim 100*b,c,d*. The rims 98*b* and 100*b* together form a double rim that is triangular. The same applies to the rims 98*c* and 100*c* and also to the rims 98*d* and 100*d*.

The walls 90*b,c,d* and 92*b,c,d* need not be plane and could be flared in shape going towards the outside of the ribbon. Under such circumstances, the cross-section of the edges of the ribbons would have a rounded shape.

The semiconductor layers 72*b,c,d* and 74*b,c,d* are deposited on the respective faces 58*b,c,d* and 60*b,c,d* after the faces of the ribbon have been coated in pyrolytic carbon. Two thicknesses $e_1$ and $e_2$ of semiconductor layers are shown in each of FIGS. 3*b,d* so as to show how the layers meet the ends 102*b,c,d* and 104*b,c,d* of the rims. It should be observed that the thicknesses of the layers are practically constant, including at the edges of the ribbon.

As in the embodiment shown in FIG. 3*a*, the deposition of semiconductor on the side faces 94*b,c,d* can be minimized or eliminated, thus facilitating the subsequent operations of opening up the edge of the carbon ribbon to enable the carbon ribbon to be eliminated by combustion.

The carbon ribbon used in the RTS method is relatively soft and plastic. It is flexible, of low density, and made by cold rolling expanded natural graphite. The weight per unit area of the ribbon lies typically in the range 150 grams per square meter ($g/m^2$) to 200 $g/m^2$, and its thickness is about 250 μm. Because of this soft and plastic nature of the carbon ribbon, the shape of its edges (naturally in the form of a rectangular parallelepiped) can be modified without difficulty. This can be done by any appropriate means, in particular by a forming method relying on continuous upsetting using mechanical means that exert pressure on the two edges of the ribbon, which pressure is directed towards the inside of the ribbon along the axis of symmetry 56*a,b,c,d*. It is also possible to modify the shape of the edges by controlled flattening, depending on the shape that is to be given.

Once the shape of the edges of the ribbon has been modified, the faces of the ribbon (including the edges) are advantageously covered in a layer of pyrolytic carbon having thickness lying in the range 1 μm to 5 μm. After this operation, the carbon ribbon is rolled simultaneously with a film of recoverable plastic or paper of thickness selected so as to avoid flattening the double rim during rolling. With a rim of height λ (see FIG. 3*a*), the thickness of the plastic or paper film should be not less than λ. During the operation of pulling the carbon ribbon through the semiconductor bath, the plastic or paper film is separated from the carbon ribbon and recovered to be used again.

It should be observed that the double rim on each edge of the carbon ribbon does not make it any more difficult to cause the ribbon to travel through the slot 14 in the crucible 10 (FIG. 1) since the slot generally includes at each of its two ends, respective holes of diameter greater than the width of the slots, as described in patent FR 2 561 139.

The invention thus provides a solution that is technically simple and inexpensive to the problem of the reduced thickness of the edges of semiconductor layers obtained by pulling a carbon ribbon. This improves the efficiency with which the area of the ribbon and the area of semiconductor are used. The projecting shape, in particular the rim, given to the profile of the edges of the ribbon makes the ribbons less fragile and thus improves the manufacturing yield of semiconductor films.

Embodiments other than those described and shown can be devised by the person skilled in the art without going beyond the ambit of the present invention, the embodiments shown in FIGS. 3*a,b,c,d* being merely example embodiments amongst other possible embodiments.

What is claimed is:

1. A method of depositing a layer of semiconductor material on at least one of two faces of a carbon ribbon, said carbon ribbon having two edges, wherein the method comprises the steps of:
   said carbon ribbon is pulled progressively upwards, substantially vertically, lengthwise through a horizontal equilibrium surface of a bath of molten semiconductor material;
   said semiconductor material becomes deposited by wetting said face as the carbon ribbon is pulled, wherein a shape of the edges of said carbon ribbon is changed so as to increase a thickness of the layer of semiconductor material that is deposited on the two edges of the carbon ribbon.

2. The method according to claim 1, wherein each of the two edges of the carbon ribbon is formed into a rim.

3. The method according to claim 2, wherein said rim is selected from the group consisting of flared shape, of substantially rectangular shape, and of substantially triangular shape.

4. The method according to claim 1, wherein, when a layer of semiconductor material is deposited simultaneously on both faces of the carbon ribbon, each of the two edges of the carbon ribbon is given the shape of a double rim.

5. The method according to claim 1, wherein the shape of the two edges of said carbon ribbon is modified by forming the two edges of the carbon ribbon by upsetting them continuously towards each other.

6. The method according to claim 1, wherein the shape of the two edges of said carbon ribbon is modified by flattening the edges.

7. The method according to claim 1, wherein said semiconductor material is selected from the group consisting of silicon, germanium, and type III-V semiconductor compounds of the GaAs family presenting congruent or quasi congruent melting.

8. The method according to claim 1, wherein the semiconductor material is silicon, and the carbon ribbon is covered in a layer of pyrolytic carbon on which the silicon layer is deposited.

9. A carbon ribbon having two edges, with at least one of its two faces being designed to be covered in a layer of semiconductor material by causing said carbon ribbon to pass substantially vertically upwards through a bath of molten semiconductor material, wherein each of its two edges on its two faces projects to form a rim, providing an increased thickness of the layer of semiconductor material deposited on the two edges of the two faces of said carbon ribbon.

10. The ribbon according to claim 9, wherein each of said two edges flares so as to form a half-round shape.

11. The ribbon according to claim 9, wherein each of said two edges forms a shoulder substantially perpendicular to said face of the carbon ribbon that is to receive the layer of semiconductor material, said rim then being substantially rectangular.

12. The ribbon according to claim 9, wherein each of said two edges forms a shoulder that slopes relative to said face of the carbon ribbon that is to receive the layer of semiconductor material, said rim then being substantially triangular.

13. The method according to claim 1, wherein each of its edges has an outside portion substantially perpendicular to said face of the carbon ribbon that is to receive the layer of semiconductor material.

14. The method according to claim 13, wherein said outside portion includes a portion that is set back towards the carbon ribbon.

15. The ribbon according to claim 9, wherein said semiconductor material is deposited on both faces of the ribbon, and each of the two edges of the carbon ribbon forms a double rim.

16. The method according to claim 9, wherein said semiconductor material is selected from the group consisting of silicon, germanium, and type III-V semiconductor compounds of the GaAs family with congruent or quasi-congruent melting.

* * * * *